United States Patent [19]

Linker

[11] Patent Number: 4,481,984

[45] Date of Patent: Nov. 13, 1984

[54] ELECTRONIC COMPONENT LEAD STRAIGHTENING DEVICE AND METHOD

[75] Inventor: Frank V. Linker, Broomall, Pa.

[73] Assignee: American Tech Manufacturing Inc., Glenolden, Pa.

[21] Appl. No.: 363,128

[22] Filed: Mar. 29, 1982

[51] Int. Cl.³ .............................................. B21F 1/02
[52] U.S. Cl. ..................................... 140/147; 72/411; 29/835; 29/838
[58] Field of Search .................. 140/147, 105; 72/383, 72/384, 385, 411; 29/566.3, 566.4, 33 F, 33 M, 855, 838

[56] References Cited

U.S. PATENT DOCUMENTS 3,880,205  4/1975  Linker et al. ........................ 140/147

Primary Examiner—Francis S. Husar
Assistant Examiner—Linda McLaughlin
Attorney, Agent, or Firm—Eugene E. Renz, Jr.

[57] ABSTRACT

An electronic component lead straightening device and method for conditioning, or reconditioning, electronic devices having an elongated body portion of possible different sizes and materials, and a plurality of metal leads extending from opposite edges of the body portion. The leads, for appropriate use of the electronic component in a circuit, such as a printed circuit on a mounting board, requires their disposition at a preferred predetermined angle to the body, and in substantial parallel mutual relationship, one to another. The present apparatus and method include an elongated generally upward angularly disposed elevated trackway, and a lead spreader and lead aligning work station, positioned on the trackway, compound work means in the station operable on an electronic component positioned in the station, with leads on opposite side edges of the body, to initially spread the leads to a predetermined appropriate angle with respect to the body, then untangle and remove overlapping of leads, if necessary, and subsequently the leads are oriented into substantially parallel relationship with respect to each other. Subsequent to the untangling or orienting and aligning steps, and in the same station, the leads can be, if desired, subjected to an oscillating movement of a nature to reduce elastic memory of the metal in the leads to ensure continued appropriate positionment thereof.

9 Claims, 36 Drawing Figures

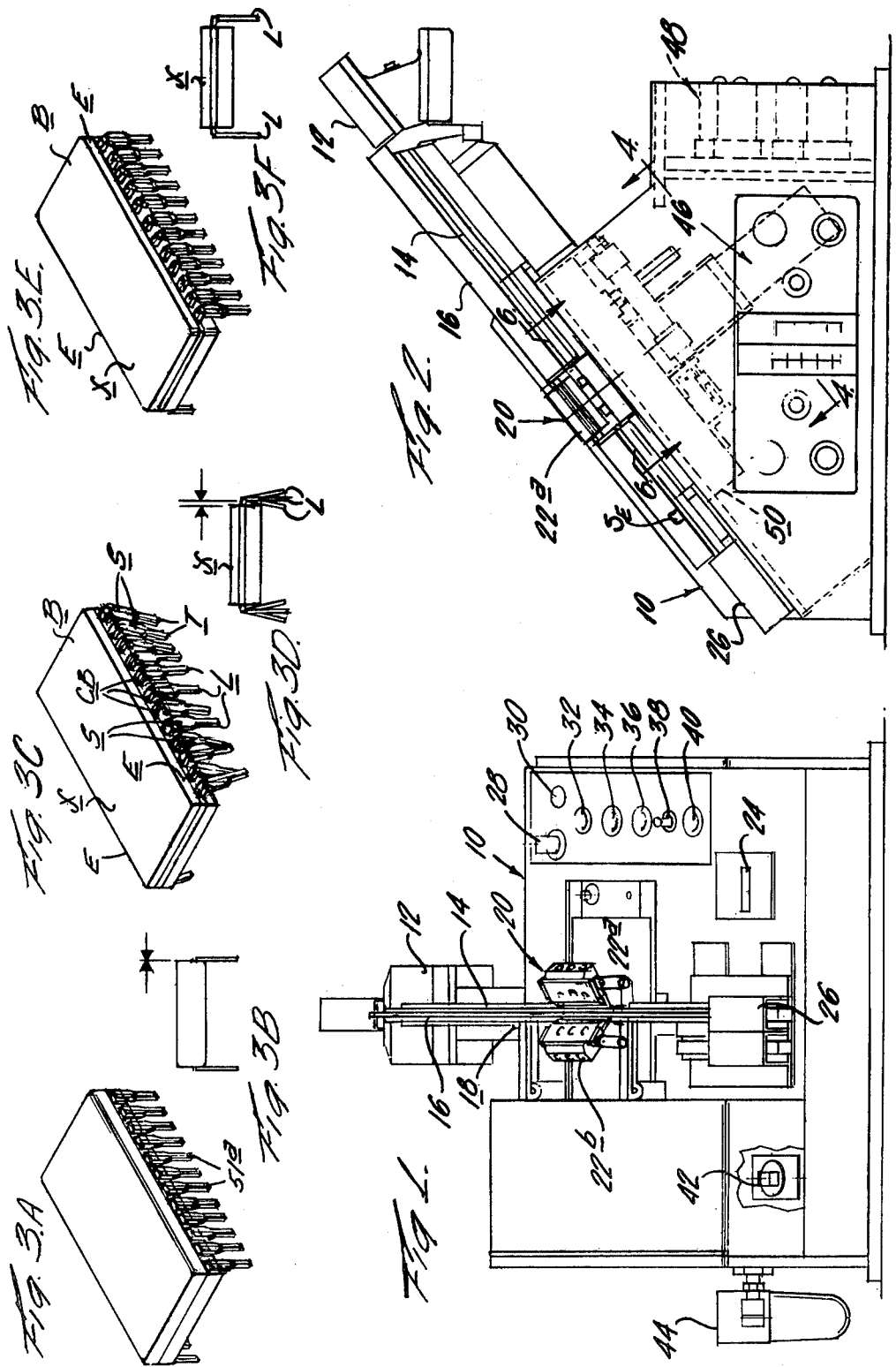

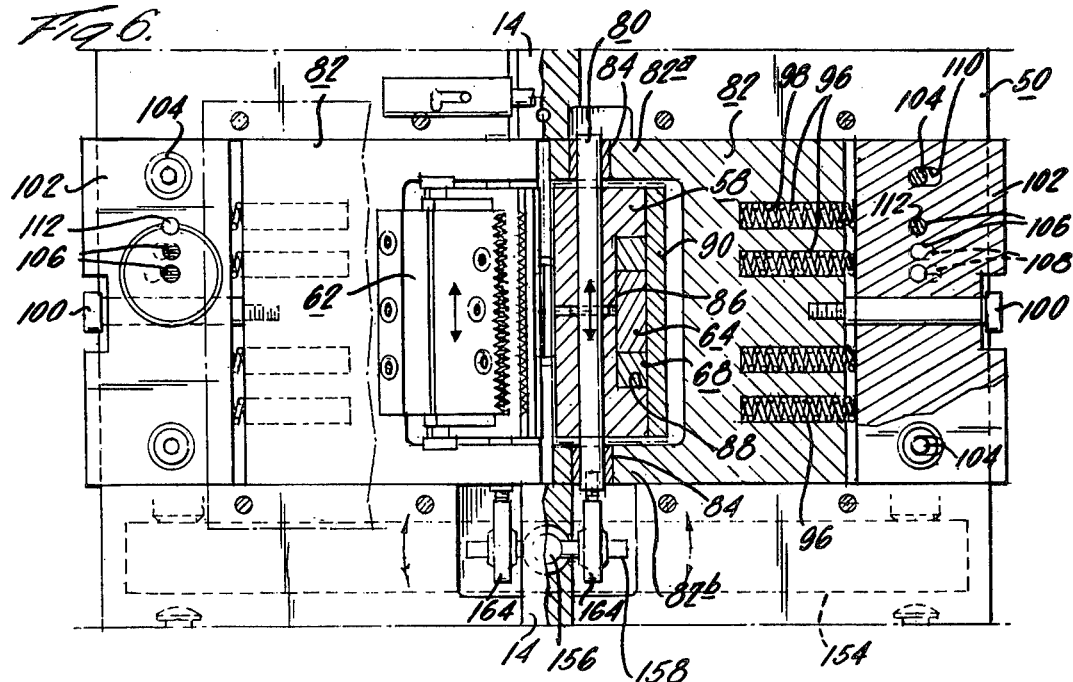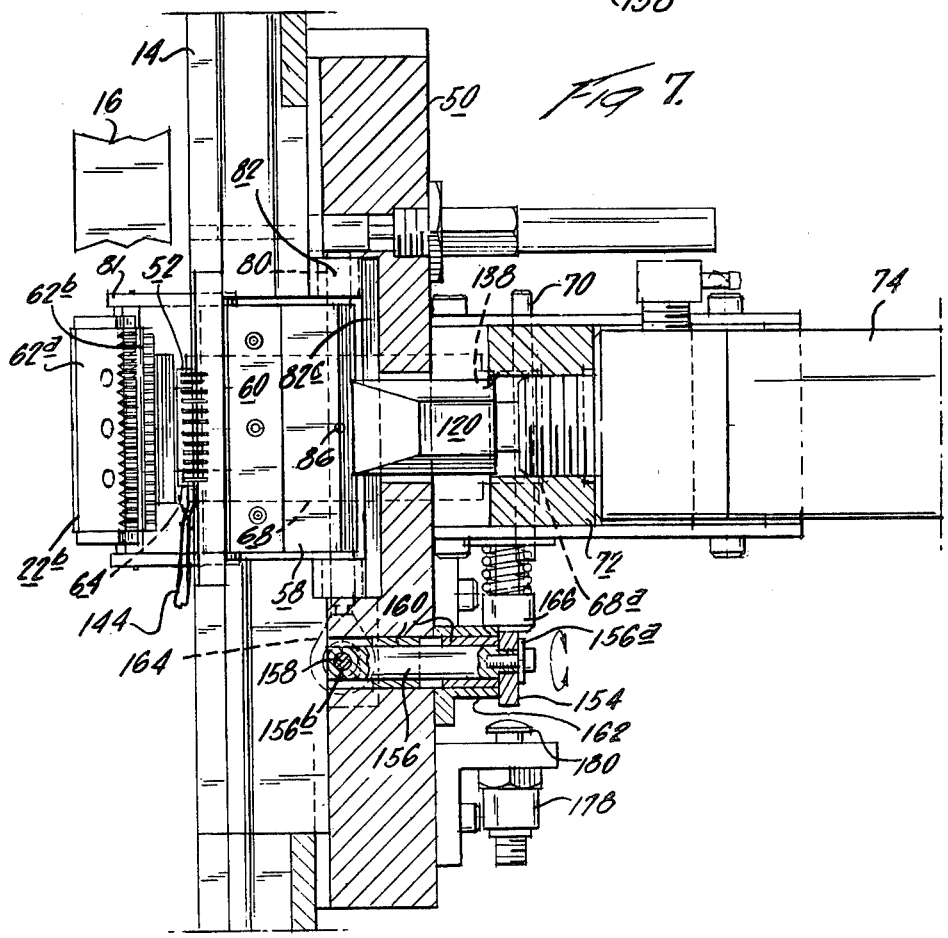

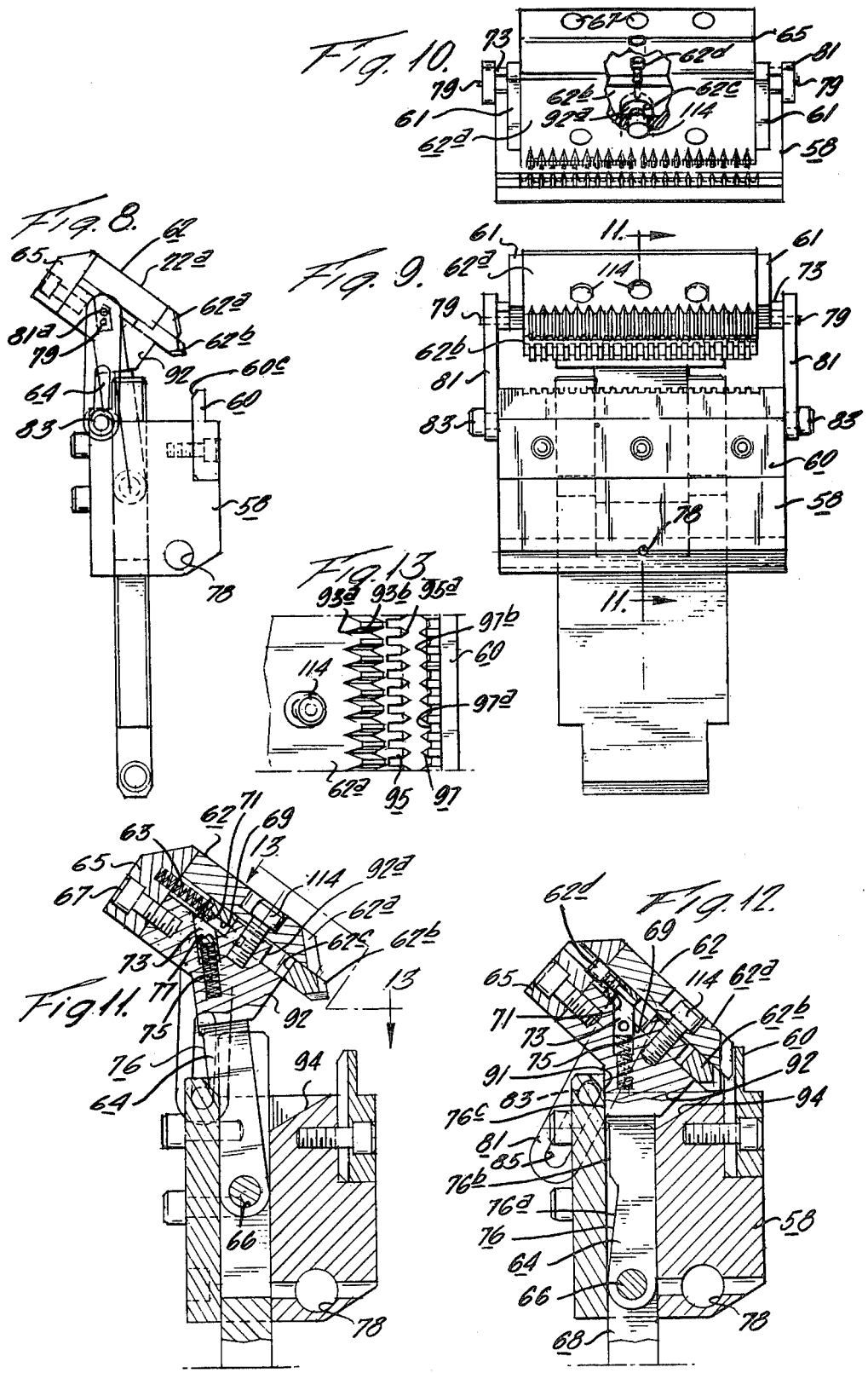

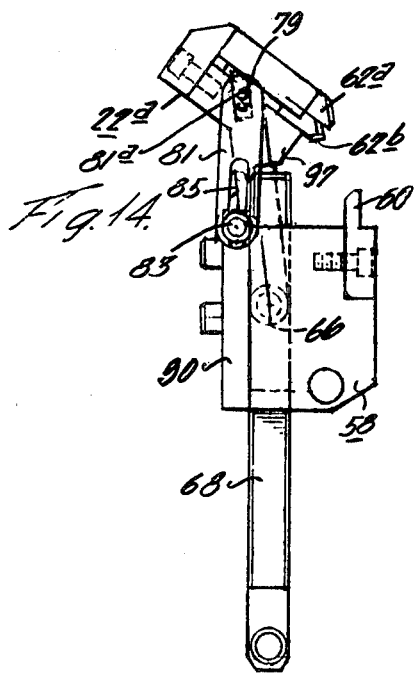
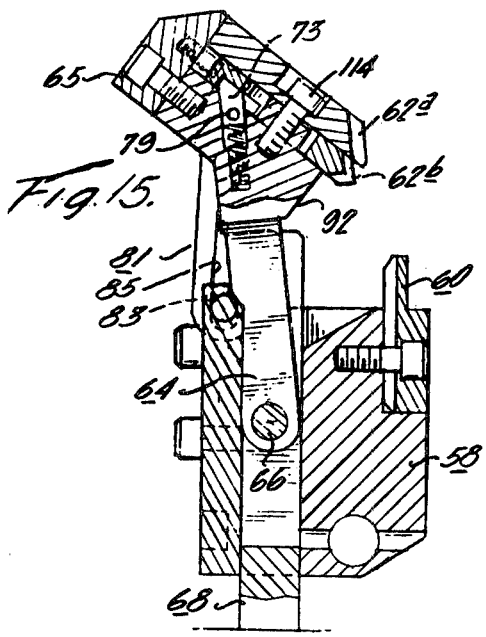
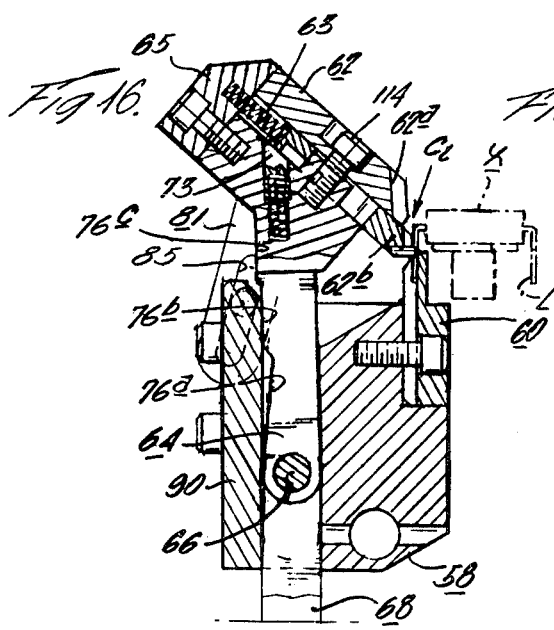
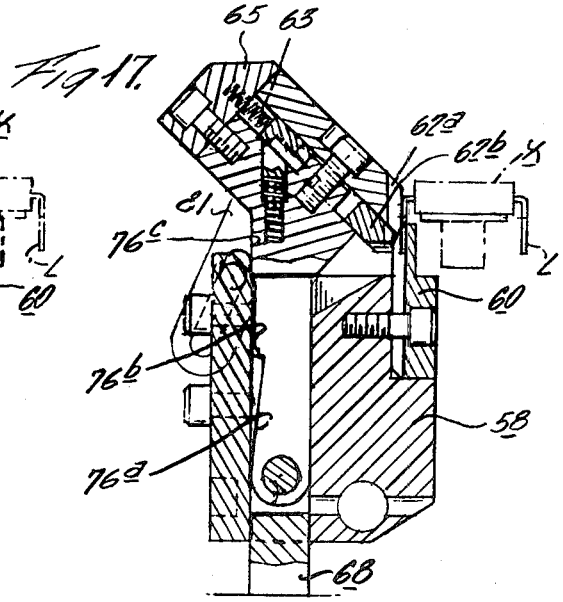

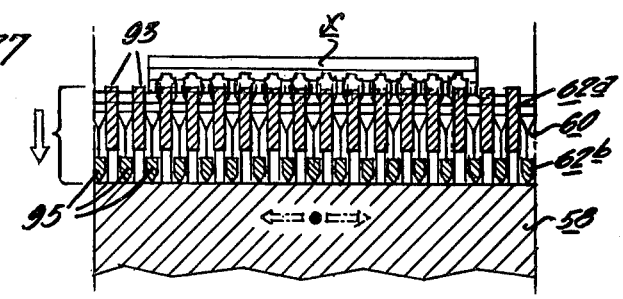
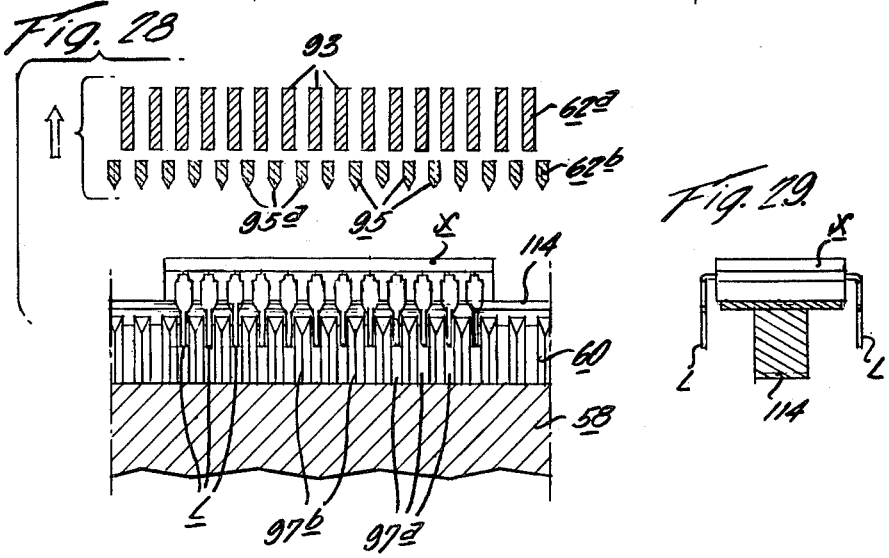
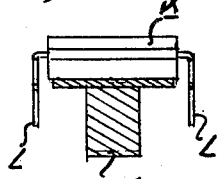

ELECTRONIC COMPONENT LEAD STRAIGHTENING DEVICE AND METHOD

TECHNICAL FIELD

The invention relates generally to apparatus and method for straightening electronic components of the type used in printed circuit boards (PCB), wherein the circuit consists of a predetermined printed electric pattern mounted on a circuit board base having openings therethrough, adapted to mount electrical or electronic components of various types, to complete a designed electric circuit.

Electronic devices of the so-called dual-in-line function type (DIPs) usually include a plurality of pin-like projections which are somewhat fragile which tend to bend during handling and shipment from a given predetermined orientation necessary to install them properly in PCBs. The electronic components used with PCBs vary substantially as regards the characteristics and functions thereof. The present invention is directed primarily to apparatus and method for straightening or reconditioning electronic components of a so-called dual-in-line type (DIP devices) used as semi-conductors or resistors in integrated circuit boards or the like. Electronic components of this type typically comprise an elongated generally rectangular body portion, made preferably of moulded material, having operatively integrated therewith a plurality of pinlike leads arranged in rows on opposite side edges thereof and disposed, preferably at predetermined angular relations to the body portion. The particular configuration and method of attachment to the body portion differs substantially in different types of DIPs. In some types, the connecting bridge for the DIPs is of relatively substantial width, below which a flat or shoulder portion of substantial width extended downwardly in a relatively vertical plane from the connecting bridge and below the flat or shoulder portion a thinned tip likewise extended downwardly and of generally a much smaller cross section than the flat or shoulder. The different configurations cause problems which differ in the different types from the standpoint of disorientation or bending of the leads with respect to the body portion; for example, during handling and prior to assembly to PCBs. The different constructions and problems created will be discussed in the following specification. The tips of the components are adapted for engagement of the leads in openings or sockets in the circuit board, the sockets comprising a plurality of prepatterned openings to receive the leads of the DIP devices.

The electronic devices (DIPs) not only vary in materials forming the body portions, but in the shape, orientation and connection of the leads thereto. The DIPs vary in lead capacity and body size. DIP devices known and used in the art heretofore have generally included types known as side brazed, plastic and ceramic DIPs. The leads are normally spread or angularly oriented with respect to and from a vertical plane extended through the DIP body and the leads are usually spread at different angles in the different types of DIPs.

The body construction to which the leads are operatively connected in the different types of DIPs normally require different configurations and arrangements of connection of the leads to the body. In heretofore known DIPs, the leads for the various types have normally included connecting bridges or portions of relatively substantial width with respect to the tip portions of the leads and additionally are disposed in a plane parallel to the body of the DIP, outwardly of which a downward depending leg portion included a flat or shoulder area and an ultimate or end tip portion. In some constructions or forms, such as plastic and ceramic DIPs, the leads of different types depend downwardly therefrom in different desired vertical angular orientation and respective alignment. Side brazed DIPs normally have the downwardly extending and oriented leads flat against the body of the side surface of the DIP. A relatively new type or configuration of lead has now come into use. This new type can be generally referred to as a "banjo" type. This "banjo" type includes, at the top, a connecting bridge which is in substantially the horizontal plane through the DIP body and extends outwardly from the vertical side edge thereof, from whence depends lead leg portion and which is in a quite substantially vertical plane. Each of the legs includes a flat or shoulder portion at the upper end of the vertical leg and of substantially greater width than the substantially horizontal connecting bridge extending or attaching the lead to the body. Below the flat or shoulder there further extends a more narrow tip portion. This "banjo" type utilizes the narrow connecting bridge to decrease the coefficient of expansion between dissimilar materials in the DIP body and the leads. The wider flat or shoulder portion is utilized to facilitate heat dissipation from the lead and the narrow tip portion is adapted for appropriate insertion into openings of the pattern in a PCB.

The older known types in use had a point of bend under stress approximately at the point of juncture between the flat or shoulder lead portion and the tip portion remote from the connection to the body portion. The "banjo" type however, has a tendency to bend in the thinner connecting bridge area adjacent the body portion. This bending or twisting of the lead occurs during, normally, handling of the DIPs prior to their connection to the PCB. In order to permit proper connection into the patterned opening in the PCB, the leads must have a proper angular disposition with respect to the DIP body. Devices have heretofore been known which were generally suitable for aligning the bent or misalignment condition of the leads for the older known and used DIP types but are not suitable for the "banjo" type where a different point of bend exists without risk of damage thereto. Since these DIPs are comparatively expensive, damage to leads during straightening can be costly and it is, therefore, important to utilize reliable methods for straightening without resultant damage and waste of DIPs. In this latter construction, the interconnecting portion can be more narrow than the downwardly depending leg portion of the lead. Each of the constructions require specifically different apparatus conditions or arrangements for straightening and alignment of the leads and to prevent damage to the body portion.

The particular problem raised in the point of bend in the "banjo" type lead could not be reliably overcome or obviated by use of known apparatus. A specifically different apparatus to eliminate the bend in the "banjo" type is necessary and the present invention is specifically directed to this problem. The straightening effort applied to the "banjo" type leads is applicable in a different manner and at the point substantially, the juncture between the connecting bridge and the downwardly extending flat or shoulder portion. In other words, since the bend usually occurs in the narrower connecting bridge adjacent the body portion, the straightening or realigning force required to eliminate the bend and to align the leads properly requires a specifically different apparatus applying the initial force substantially at the top and between the flat or shoulder areas of adjacent leads. Subsequent to an initial alignment by a force applied at this point, then the flat or shoulder portion and the downwardly extending tip portion is further aligned.

While the present invention is primarily for use in the new banjo type DIPs, it can be used with the other known DIPs. The hereinafter described apparatus and method will be principally directed to a banjo type DIP. The detailed description of the apparatus of the present invention will be primarily directed to this banjo type of DIP and lead. However, it will be readily understood that the principles of the invention are applicable in a much broader usage to the other known types. Adjustment features are incorporated to permit use with the different types.

BACKGROUND OF THE INVENTION

As well known in the art, DIPs consisting of a body portion, and attached and depending leads connected thereto for assembly of a DIP into a PCB or the like, are manufactured with the leads disposed in a particular arrangement adapted for insertion in the predetermined array or pattern of holes or sockets in a PCB. The material of the leads and their connection to, and disposition on, the DIP bodies frequently result in a bending and distortion of the leads from the initial manufactured construction.

There are different types of DIPs known and used, including types generally referred to as side brazed, plastic and ceramic. Each of these normally differs in the material of the body, and sometimes in the specific arrangement and connection of the leads to the body. Additionally, the connection mode of the leads to the body differs in the different types of DIPs. These differences were generally slight, and specific apparatus and/or adjustments of the mechanism were available to initiate and to ensure appropriate spreading of the leads to an appropriate angular dispositon with respect to the body, and further to straighten the leads into parallel relationship with one another. The known machines, however, would not work with banjo type leads due to the type and location of bend as above mentioned. In some instances leads may be tangled or overlapped during handling. The known devices could obviate this problem also as regard the older types of DIP leads. They would not, however, accommodate or work with "banjo" type leads since the straightening or aligning apparatus and steps thereof might tend to sever or shear portions of leads and the problem arises primarily due to the particular point and type of lead bend as above mentioned. In these operations it is important that the straightening apparatus contacts and acts only upon the leads, and does not contact the body in such a way as to cause breakage or damage thereto. In side brazed types for example, the leads are contiguous to the side edges of the body, whereas in the plastic and ceramic types they can be slightly outwardly spaced by connecting portions of the leads and which can vary in width.

The problem is particularly acute in the "banjo" type of lead since the connecting bridge is of narrow width and extends substantially in the flat plane of the body outwardly a distance prior to the point of downward depending leg portion, at the top of which a larger flat or shoulder area is connected to the connecting bridge and the bend occurs in the connecting bridge rather than at the juncture point between the shoulder portion and the more narrow tip. The point of application of the straightening force or effort in this "banjo" type is preferably applied at the upper edge or end of the flat or shoulder portion or in other words where this portion is attached to the connecting bridge. In the types of straightening devices known, the bent leads are urged or wiped into contiguous grooves, preferably of a V-configuration and in use, the "banjo" type of lead, due to the type of bend and construction of the lead might result in a tendency for two adjacent leads to be forced into the same straightening V-shaped groove and might result in a shearing off of the lead by a coacting wiper blade which is used to force the DIPs into the aligning grooves. The reason for specifically different apparatus accordingly is obvious, i.e. to permit use with the different and banjo types of DIPs.

Heretofore, mechanisms have been known which are used for the straightening of the older form leads of electronic components. An example of this is disclosed in prior U.S. Pat. No. 3,880,205, dated Apr. 29, 1975, the present inventor being one of the patentees of this patent. This previous machine, however, was not functionally suitable for straightening the "banjo" type lead without the risk of damage to the DIP under certain bent lead conditions and furthermore, included a plurality of sequentially spaced and operating stations, one for spreading of the leads, and a subsequent station for combing the leads into appropriate parallel relationship whereas in the present machine, the steps of spreading of the leads into the appropriate angle with respect to a vertical plane through the body of the DIP and the subsequent combing or aligning of the leads into appropriate parallel relationship is all accomplished at a single work station.

The apparatus and method of the present invention also includes means for eliminating or removing elastic memory of the material of the leads, so that once oriented the leads will remain in the pattern necessary for assembly to a PCB, and distortion or return of the leads to an angularly displaced position is obviated.

These prior difficulties and problems are overcome by the present invention. The present concept, as will appear hereinafter, results in a machine which is capable of straightening and aligning "banjo" type leads, which was not possible with prior known apparatus without the risk of damage to the leads, and furthermore, is capable, by means of adjustment of components thereof, to adapt the apparatus for the desired function with other known types of DIP and leads or constructions thereof. The present apparatus uses a compound acting lead straightening head including the plural components of lead separator blades, lead straightening or combing blades, and wiper blade mechanism for final straightening of the leads for all types of DIPs as mentioned. The present apparatus further includes an oscillating mechanism selectively operable, for removing or reducing elastic memory in the lead material to eliminate the aforementioned memory problem drawback. The particular structure and manner in which these new and improved results are accomplished are set forth in detail hereinafter.

While the present invention will be specifically described in a preferred constructional form adapted for use on banjo type DIPs, reference will be made to the adjustable aspects of the invention to accommodate use of the same machine with other types of DIPs.

Obviously the invention is not limited to the specific structure shown and variations and specifics of constructional details and materials will be obvious and within the scope of the invention.

BRIEF DESCRIPTION OF THE DRAWINGS

The accompanying drawings illustrate a preferred embodiment of the invention, and when taken together with the description serve to explain the principles and the structure of the invention. In the drawings;

FIG. 1 is a front elevational view of a mechanism for straightening leads on DIPS;

FIG. 2 is a right side elevational view of the device shown in FIG. 1;

FIG. 3A is a greatly enlarged perspective view of a side brazed type DIP;

FIG. 3B is an end elevation of the side brazed DIP of FIG. 3A, showing the leads as being flush with the side wall of the DIP body;

FIG. 3C is a greatly enlarged perspective view of a ceramic type DIP whose leads have been bent or misaligned, the leads being of a banjo type;

FIG. 3D is an end elevational view of the DIP shown in FIG. 3C and illustrating, or showing a small connecting bridge interconnected to the DIP body and spacing downwardly extending leg portions of the lead from the DIP body;

FIG. 3E is a perspective view of the DIP of FIG. 3C with the leads restored to proper orientation;

FIG. 3F is an end elevational view of the DIP shown in FIG. 3E;

FIG. 6 is a fragmentary enlarged plan view taken on line 6—6 of FIG. 2, with portions removed and partly in section, showing additional details of the mechanism used to straighten and oscillate leads of the DIP;

FIG. 7 is a sectional elevational view taken on line 7—7 of FIG. 4, disclosing, in a fully deactivated position, additional details of the DIP lead straightening wiper blade mechanism and actuating device;

FIG. 8 is a side elevational view of one of the wiper blade assemblies;

FIG. 9 is a front elevational view of the device shown in FIG. 8;

FIG. 10 is a top plan view of the mechanism shown in FIG. 9;

FIG. 11 is an enlarged transverse sectional elevational view taken on the line 11—11 of FIG. 9;

FIG. 12 is a view similar to FIG. 11 but showing the wiper blades in a fuly downwardly activated position;

FIG. 13 is a fragmentary plan view taken on the stepped section line 13—13 of FIG. 11 illustrating the tooth configuration and relationship of the wiper blades and associated separator blade;

FIG. 14 is a view similar to FIG. 8, showing the wiper blade assembly of FIG. 8 adjusted for straightening the leads of side brazed DIPs;

FIG. 15 is an enlarged fragmentary transverse sectional view similar to FIG. 11, showing in greater detail the locked back floating wiper blade condition;

FIG. 16 is a view similar to FIG. 11, showing the head assembly in a particular intermediate position of downward travel such that the floating wiper blade teeth have just passed between and slightly beyond the wiper portions and connecting shoulders of adjacent leads and making initial contact with the camming face of the separator blade;

FIG. 17 is a view similar to FIG. 16, and showing the wiper blade assembly in a lower working position wherein the floating wiper blade having ridden over the cam surface of the separator blade is now engaging the crown of the separator teeth and has moved rearwardly within the assembly head, in addition it illustrates the point at which the fixed wiper blade is directed arcuately into working engagement with the leads by means of the third cam surface.

FIGS. 21-29 inclusive are views generally similar to FIGS. 18-20 and illustrating the sequence and method by which the bent and distorted leads are restored to a proper plane and straightness, in the absence of damage to either the DIP body or the leads themselves. These Figs. will be hereinafter more specifically described.

DETAILED DESCRIPTION OF THE PREFERRED EMBODIMENT

Figure 4:
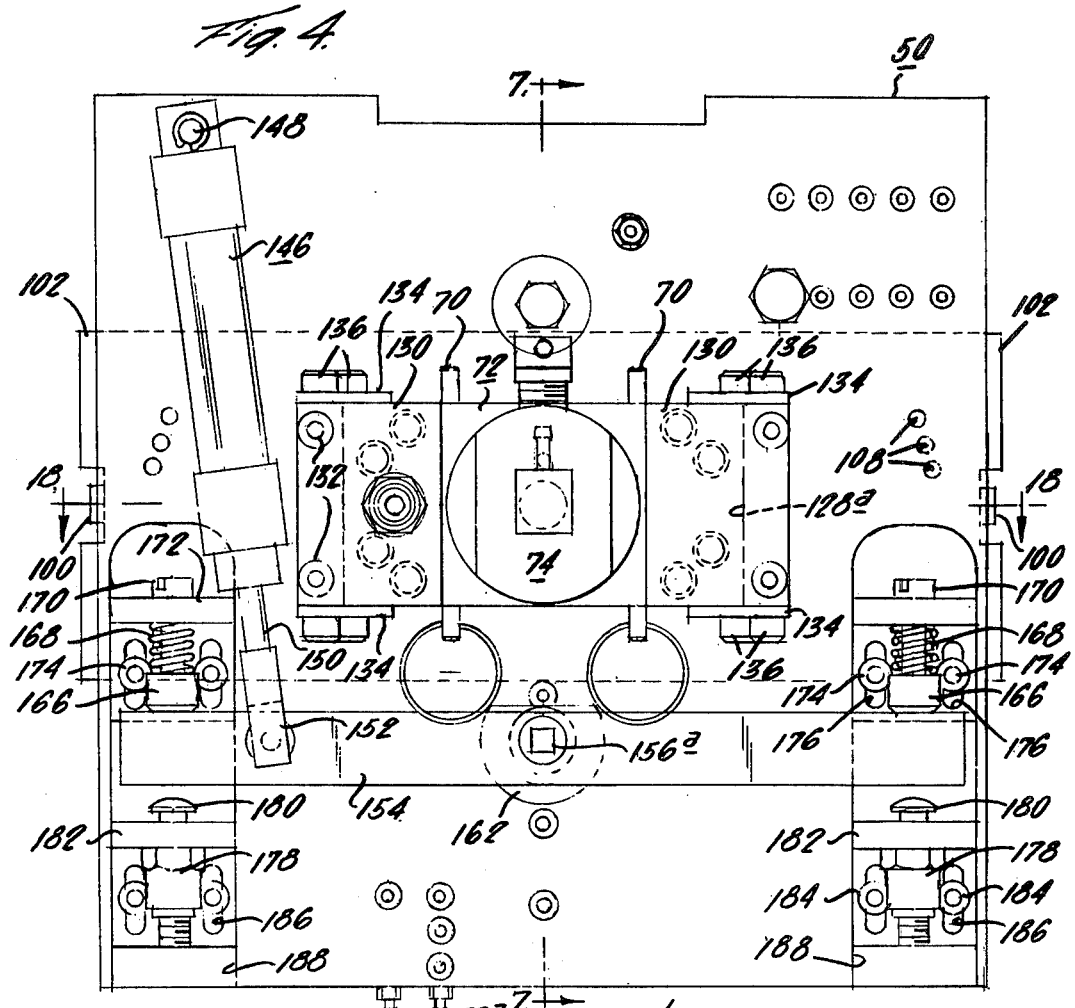
FIG. 4 is a sectional view taken on the line 4—4 of FIG. 2 showing an enlarged, fragmentary, rear elevational view of a slide housing and accompanying parts.

Before entering into a detailed description of a preferred embodiment of the invention, as follows, reference is made to the previous discussion concerning the DIP generally designated X constructions generally. These as mentioned with reference to FIGS. 3C and 3E include a body portion B, leads L which are attached and extend from the opposite side edges E of connecting bridges CB extending outwardly in the plane of the body, and downwardly depending leg portions T including a flat or shoulder portions S and ultimately a tip terminal portion. The connecting bridge CB is substantially more narrow than the flat or shoulder portion; and upon handling or mishandling of the DIPs, bending of the leads tends to occur in the length or region of the connecting bridge CB as aforementioned. This can result in a bent or bending condition, or misalignment of the leads, into the condition shown in FIGS. 3C and 3D, and in extreme conditions might even include an overlap or tangling condition. The present invention due to its construction particularly in the new and novel compound straightening and aligning head. serves to apply an initial straightening force at the upper corners of the flat or shoulder portions S of the DIPs, outwardly from the body B of the DIP and at the juncture of the connecting bridge CB and shoulder portion S. Subsequent to passage through the machine the condition of the leads as aligned and straightened is shown in FIGS. 3E and 3F.

In FIG. 3A, for illustrative purposes, there is disclosed a side-brazed type of DIP wherein the leads 51a are in general abutting contact with the side edges of the DIP, and affixed thereto by brazing. As will appear later in this application, the apparatus provides adjustment means whereby the type of DIP shown in FIG. 3A, wherein there is no clearance between the body and the DIP, such as in the banjo type of FIG. 3C, and/or other types of DIPs which include connecting arms, but which are not narrowed with respect to the flat or shoulder portion, can be accommodated in the machine, and for side brazed types solely by adjustment or deactivation of the floating wiper blade, as will appear. In these later mentioned types of DIPs, however, the old known types of straightening devices were operable but did not include the refinements and advantages of the present device which is applicable for use in connection with current used types of DIP leads.

As previously mentioned, the present invention utilized a compound head structure which incorporates therein separator or spreader blades having a serrated face for receiving the leads of a DIP, a floating wiper blade, and a so-called fixed wiper blade. Generally speaking, this head assembly comprising the fixed and floating wiper blades is devised to approach a DIP, and the leads thereon, in a generally arcuate manner such as to avoid contact with the DIP body, and refinements such as bevelled edges adjacent the upper edges of the working surface of the spreader blades, and the configuration of and position of the teeth on the floating wiper bar, aligned with the apexes of the teeth on the spreader bar, and the alignment of the teeth on the fixed wiper blade to the grooves in the floating wiper blade, serve functionally and sequentially to straighten the bent leads and to wipe them into the fixed grooves of the spreader blade for the final alignment positionment.

Referring initially to FIGS. 1 and 2, there is shown generally at 10 apparatus for straightening the leads of DIPs. The device includes a turret-like mechanism 12 for the insertion of tubes containing DIPs to be straightened, located at the top of the device. From the turret insertion device 12, there extends an inclined ramp-like device or trackway 14 upon which incoming DIPs, whose leads are to be straightened are positioned and ride during straightening. Directly above ramp 14 and centrally located along its length is a bar-like device 16 for restraining the DIPs from falling off the track, especially since air suspension means cause them to ride substantially friction-free down the track as they approach a first gate mechanism 18. The gate 18 admits DIPs singly into a lead straightening position or station 20. After the straightening, and a subsequent oscillation step performed by the head assemblies 22a and 22b, if required to obviate spring-back of the leads due to elastic memory, a finished DIP is allowed to proceed along the track 14 past a counting device 24 to a discharge station 26, all as shown in FIG. 1.

There are various controls and devices on the front of the panel including the main power switch 28, power on indicator 30, a reset button 32, a sensor-1 override 34, a cycle button 36, toggle switch 38, and shift and reset buttons 40. In addition, there is shown on the left hand side of FIG. 1, an on and off switch 42 for the oscillator control. The oscillator mechanism and its function will be explained hereinafter. Air filtering means is positioned at 44 on the left hand side of the unit and, as shown in FIG. 2, on the right hand side of the unit there are air pressure indicating means including dials and controls, generally designated 46. Mounted to the rear of the device is a logic control system generally designated 48, and which unit is removable and replaceable for appropriate controlled functioning of the device for straightening leads in different types of DIPs. Shown in dotted lines in FIG. 2, is a slide housing 50 mounting the lead straightening mechanisms and cylinder actuating devices for an oscillating mechanism. These mechanisms will also be explained in detail hereinafter with reference to other figures of the drawings.

The finished DIP is allowed to travel along the track 14 past a counting station 24 to a discharge station 26, and a subsequent DIP is at the same time entering into station Z0 for a possible straightening operation thereon. This is a repetitive cycle all controlled by the logic generally indicated at 48. As is readily understandable, the logic input into the unit 48 will control the overall function and operation of the device and, dependent upon the various adjusting features incorporated therein, will accommodate DIPs of different types and sizes.

Undamaged DIPs will pass unaffected through the straightening station. The separator and wiper blade assemblies 60, 62a and 62b, respectively at a station shown generally in FIG. 1, will be more clearly understood from a study of FIGS. 8 through 12, which detail only one of an identical pair, generally designated 22a. Each of these being identical, a description of one will serve for an understanding of their construction and their operation.

Figure 18:
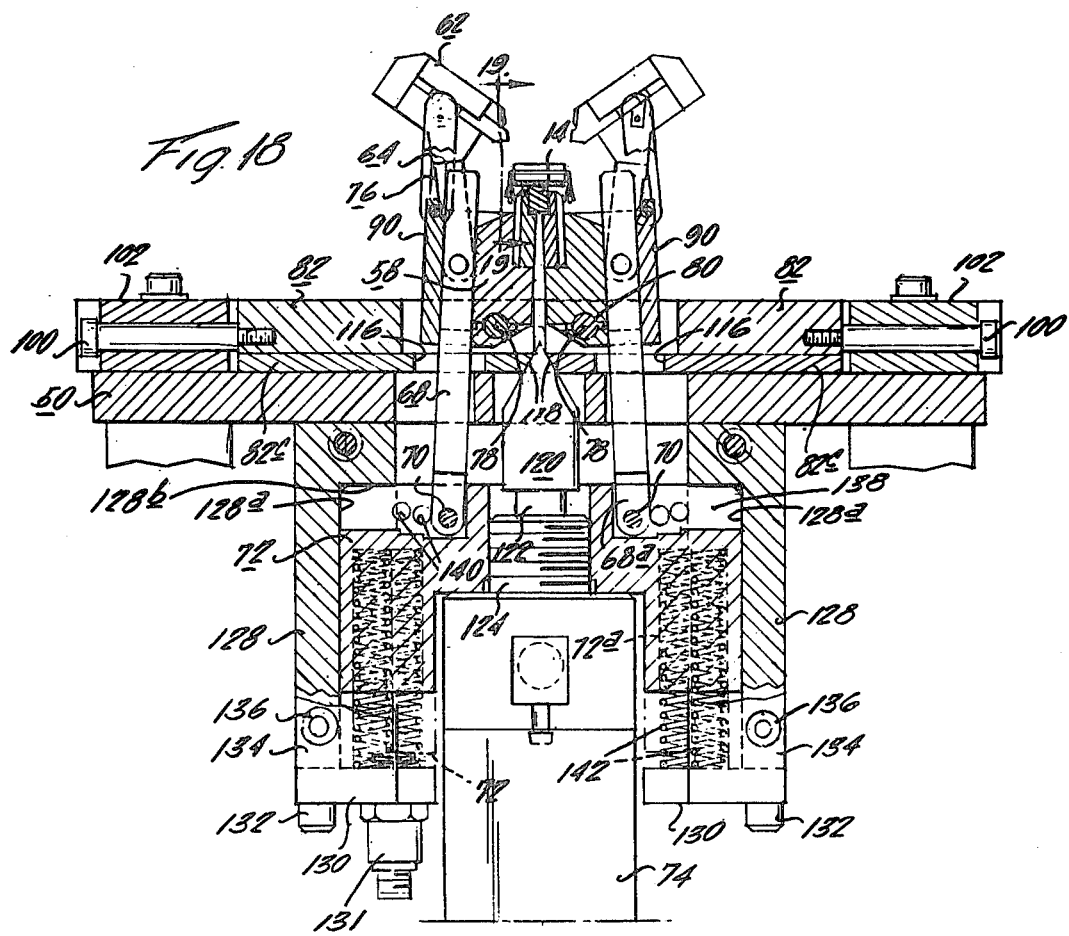
FIG. 18 is a sectional plan view taken on line 18—18 of FIG. 4, and showing details of the wiper blade assemblies, ram and associated slide mechanisms in an open position.

As shown in FIG. 18, and more clearly in FIGS. 8 through 12, the separator and wiper blade assemblies include generally a body portion or block 58, a separator blade 60 and a compound wiper head assembly comprising an upper fixed wiper blade 62a and a lower floating wiper blade 62b. The separator blade is fixedly mounted to the block 58. The compound wiper blade 62 is carried by a first slide 64, whose rear surface contains a plurality of cam faces 76 constituting a series whose function will be later described. The mounting block 58 is pivotally secured at a point 78 by means of a slideable rod or shaft 80, passed between the bifurcated ends of a carrier slide member 82.

As shown in FIG. 6, the carrier slide 82 has two bosses or bifurcated ends designated 82a and 82b. The bifurcated ends 82a and 82b contain bushings 84 which, as will be noted, are at each end where the rod 80 is slideably contained. This assembly is more clearly shown in FIG. 7. The carrier block 58 is securely fastened to the slideable shaft 80 by means of a short dowel or pin 86. While a single pin 86 has been shown, it is to be understood that a plurality of such might be used for interconnection of the parts. As clearly shown in FIG. 6, the block 58 contains a channel 88 through which the slide member 68 is carried for slideable motion, and is contained within the channel 88 by means of an outer cover plate 90. It is seen from FIGS. 8, 11 and 12 that the slide 64 for mounting the compound wiper blades 62a and 62b, has a shoulder or shelf portion 92. This necessitates a pocket or cavity in the block 58, shown at 94, so that when the compound wiper blade 62 is in its fully engaged or fully retracted position, the shoulder 92 can seat within the pocket 94 with a clearance, allowing the floating wiper blade 62b to engage the upper face of the block 58 to latch the floating wiper blade or comb 62b in a retracted position (see FIG. 12) for the next cycle of operation.

Again, with reference to FIG. 6, the carrier slide 82 has, at the opposite side from the bifurcated ends 82a and 82b, a series of compression springs 96 whose main body portion is contained within bores 98. The compression springs 96 tend to urge the carrier plate 82 towards the center line of the track. Also, centrally located within the body of the carrier plate 82, there is an adjustment screw 100, utilized for fine adjustment of the carrier plate 82, and separator-wiper blade assemblies 22a or 22b, between the stopblock 102 and the head of adjustment screw 100 defining an inner point or limit of travel of carrier plates 82 when the ram 74 is non-energized. In other words, the head o the screw 100 limits the movement of the carrier plate 82 toward the center line of the track 14. The stop block 102 is fixedly mounted to the slide housing 50 by means of bolts or machine screws 104. In addition, the stop block carries a series of vertically aligned apertures or holes 106, for indexing with three similar, but angularly displaced holes 108, in the slide housing 50. These index holes 106 provide adjustment for the particular angle of leads on the DIP whose leads are being straightened, as desired by different manufacturers or users such as ceramic, plastic, or sidebrazed, and act in conjunction with the angularly displaced holes 108 in housing 50 shown in FIG. 4. There also are apertures for the bolts 104, consisting of elongated slots 110, which permit a sliding movement of the stop block for alignment with the proper indexing hole and angularly displaced hole when a certain type of DIP is to be run. When for instance, a DIP is to be run through the machine, as shown in the accompanying drawings FIG. 6, the screws 104 are loosened, and the stop block is positioned by placing a fast pin 112 within the uppermost index hole 106 of the slide plate 102, and registering this with the uppermost index hole of the angularly displaced holes 108 of the slide housing 50.

The compound wiper blade 62, as seen from FIGS. 6 and 7, and clearly illustrated in FIGS. 11 and 12, has a first fixed blade 62a fixedly mounted to the shoulder-like portion 92 of the first slide member 64 by means of screws 114. The slide plate 82 includes a second plate member 82c, FIG. 7, which has a port or opening therethrough at 116, FIG. 18, for the passage of the slide 68, and in addition, at its innermost terminal end, there is an inclined cooperating cam face 118, FIG. 18, that slideably contacts with a cam-shaped actuator head or member 120. Cam-shaped member 120 is fixedly secured to an actuator rod 122 of the main cylinder 74. The cylinder 74 has a threaded boss 124. The cylinder 74 is fixedly attached to the cylinder mounting slide 72 by the threaded boss member 124.

FIGS. 7 and 18 show the mounting of the main cylinder 74, and the cylinder slide member 72, by means of generally L-shaped members 128. The opposite end of the mounting block 128, or lowermost portion as shown in FIG. 18, has attached to its terminal end, end plates 130 whose function serves as a spring retaining member as shown in FIGS. 4 and 14 and which are attached by means of machine screws 132, which pass through the end plates 130, the generally L-shaped bosses 128, and threadedly engage tap holes in the member 50. One of the end plates 130, such as the one to the left of ram 74 in FIG. 18, mounts a slide detecting limit switch 131 whose function is described hereinafter. This interlocks the spring retaining end plate 130, the generally L-shaped bracket 128, and the slide housing 50 into one integrated or integral part. The slide member 72 is centrally located such that its outer terminal edges ride against the inner face 128a of the generally L-shaped member 128, and is retained by means of retaining plates 134, mounted by means of screws 136 at both the top and bottom of the generally L-shaped member 128.

As previously noted, a fast pin 70 is used to tie the lower terminal end of the slide 68 to the main cylinder mounting block slide 72, the lower end having a reduced end 68a inserted into a cavity 138 in the main cylinder mounting slide 72. The fast pin 70 can be selectively positioned within three apertures 140, FIG. 18, in cylinder mount slide 72, depending upon the type of DIP whose leads are to be straightened. As shown in the drawings, the innermost aperture, i.e. the aperture closest to the center line of the ram 74 shows a connection and set up for one type DIP. The adjustment means shown in the stop block and slide mounting block 72 are necessary to accommodate or handle the three main types of DIPs referred to above. The contact approach or angle of the blades can, by this arrangement, be varied to accommodate body size and angular configuration of the different DIP types and serves to prevent abrasion or deleterious contact when the wiping action is applied for straightening of the leads. For example, for the adjustment shown, that is inner aperture 140, the leads have a zero angle, for the center aperture approximately 3° and for the outer aperture approximately 6°.

As shown in FIG. 18, there is positioned between this main cylinder mounting slide 72 and the spring retaining plate 130, a series of springs 142. The terminal ends of the springs are contained within bores 72a of slide 72, and are of the compression type. This arrangement is such that when the main cylinder is deactivated, the springs 142 urge the main cylinder 74 and its mounting slide member 72 forwardly into engagement with a shoulder or stop-face 128b in the generally L-shaped boss 128.

In addition, there is shown in FIGS. 4, 5, 5A, 5B, 6 and 7 means for imparting an oscillating motion to the leads in order to remove elastic memory from the material constituting the leads. While oscillation can be selectively increased, decreased or deactivated, it has been found necessary in substantially all DIPs.

The mechanism for performing the oscillation is as follows: with reference to FIG. 4 there is shown an oscillating cylinder 146 whose upper terminal end is pivotally and fixedly secured to the slide housing 50, as shown at 148. From the lower terminal end of the cylinder 146 there extends an actuating rod 150, which mounts a clevis 152 which pivotally connects with an actuating drive bar 154. The drive bar 154 is centrally and pivotally mounted for rotation about a central pin 156. With particular reference to FIG. 7, the pin 156 has at its right hand side a square-shaped mounting boss 156a which cooperates with a similar square-shaped aperture on the drive bar 154. In addition, the pivot pin 156 carries at its left hand end a hole 156b through which a cross mounting bar 158 is slideably positioned. Pin 156 is carried within the main body of the slide housing 50 by sleeve bearings 160. One of the sleeve bearings 160 is mounted within the block 50 and another is carried in a bearing housing 162 which dimensionally spaces the drive bar 154 from the slide housing 50. As shown in FIG. 6, the cross mounting bar 158 carries at its outer end spherical bearing fittings 164, whose upper end includes a threaded portion which is screwed into a tapped hole in the rod 80.

The drive bar 154 normally rests in a horizontal position and is engaged on its upper surface by bumpers 166 (FIG. 4). These bumpers are vertically displaceable, and spring biased by means of a spring 168, by adjustable screw 170 in adjustable bracket 172, whose adjustment can be effected by means of bolts 174 coacting with slots 176, and when the desired position is obtained firmly secured to the slide housing 50. Also shown in FIG. 4 are two limit switches 178 directly beneath the bumpers 166 and axially aligned therewith. These limit switches 178 include an actuator head portion 180. The limit switches are carried in mounting brackets 182, adjustably mounted by means of screws 184 coacting with slots 186 in the bracket 182. Both the brackets 172 and 182 are centrally and axially positively aligned by having their mounting flanges positioned accurately within a milled slot 188 in slide housing 50.

Figure 5:
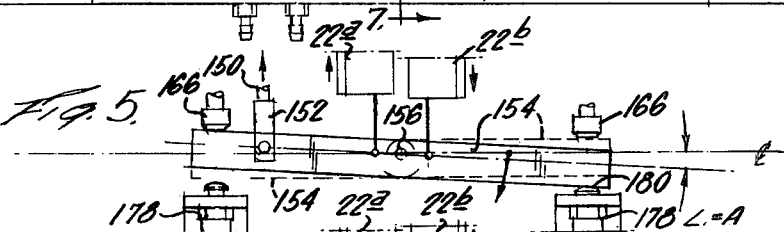
FIGS. 5, 5A and 5B respectively show schematically and sequentially, details of an oscillator mechanism for actuating associated mechanism parts such as the wiper blade assemblies.
Figure 5A:
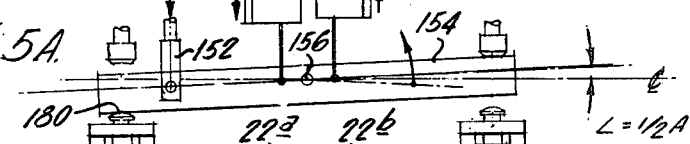
Figure 5B:
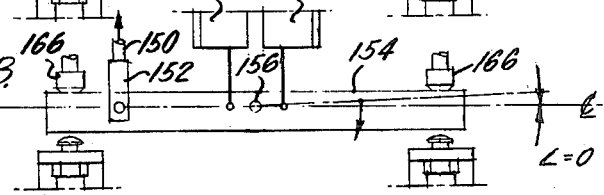

In FIGS. 5, 5A and 5B, the sequence of oscillation operations is shown. Referring to FIG. 5, the drive rod 154 is normally disposed in a horizontal position, shown in FIG. 5 as a series of dashed outlines. The actuated position of the bar is shown in full lines. The cylinder 146 has drawn up upon its actuator bar 150, thereby drawing with it the clevis 152, which elevates the left hand side of the actuator bar 154 until the right hand side of the actuator bar 154 strikes the right limit switch actuator button 180. Thereby the condition referred to has passed through a given angle A, and at this particular moment the pivot pin 156 has duplicated this angular displacement and applied it through cross bar 158, through the spherical bearings 164. Then the angular displacement of the cross bar 158 is translated into linear vertical motion by the rods 80, and thence to the assemblies 22a and 22b. Member 22a moves upwardly while member 22b moves downwardly in regard to the drawings. This relative motion of the various components are shown by arrows placed adjacent the individual members. When this condition has been reached, that is, the actuator bar 154 has moved through an angle A and contacted the limit switch actuator button 180, the logic is such that the oscillating cylinder is reversed, and the actuator rod is now given a downward motion, thereby driving the clevis 152, and its interconnected drive bar 154, in a counterclockwise direction, as shown by the arrow. The left hand portion of the actuator bar 154 now engages the left limit switch actuator button 180. It will be noted that in this motion the bar has passed through the angle A, and additionally an added increment in the opposed or opposite direction of one-half A, as depicted, from the center line on the right hand of FIG. 5A. Having obtained this second condition as shown in FIG. 5A, the logic is such that the cylinder 146 is instructed to be energized in an upward direction so that it draws in the actuator rod 150, the clevis 152, and its associated actuator bar 154. The bar 154 now moves in a clockwise direction about the pivot 156 until it attains a truly horizontal position as shown in the drawings, and all conditions are restored to a zero angle of displacement by means of the spring biased bumpers 166 (FIG. 14). It will be noted in FIG. 5A that the relative motion of the assemblies 22a and 22b is opposite to the motion established in FIG. 5. It is further to be seen from these Figs. that the relative motions of members 22a, 22b are simultaneously in opposite directions with respect to one another. This type of movement or oscillation, in conjunction with the distance denoted by the angles through which it moves, serve effectively to eliminate or remove elastic memory in the respective leads on the DIP.

Since lead strength or resilience can vary from device to device, it may not be necessary to use the oscillator action to achieve desired lead straightness. It has been found, however, that the majority of devices do require oscillation.

With particular reference to FIGS. 8 through 13, details of one of the wiper blade assemblies will now be discussed. FIGS. 8 and 9 generally depict the outward physical appearance of the compound wiper blade assembly 62. Referring to FIG. 11, the compound wiper blade assembly 62 comprises a generally large head portion atop the upper portion of slide member 64, having a shoulder portion 92 to which a fixed wiper blade 62a is secured. The blade 62a is secured by means of three bolts 114, passing through a slotted aperture in the blade 62a allowing for minor adjustments of the blade 62a, and thence threadedly engaging upstanding bosses 92a on the shoulder 92. Directly beneath the fixed wiper blade 62a, slidably interposed between the shoulder 92 and the undersurface of upper wiper blade 62a, there is slidably mounted a second or floating wiper blade designated 62b. The second or floating wiper blade 62b has three elongated slots which surround upstanding bosses 92a. These slots 62c and corresponding bosses, tend to limit the inward and outward motion of the blade 62b with respect to its limits of travel. The floating wiper blade 62b is held captive by means of the upstanding bosses 92a, the undersurface of the upper fixed wiper blade 62a, and the upper surface of the shoulder 92.

In addition, the floating wiper blade 62b is urged forwardly by a series of small compression springs 63 having one end thereof recessed in the trailing edge of wiper blade 62b, the other end of the springs 63 engaging within recesses formed in a heel plate member 65. The heel plate member 65 is secured to the shoulder 92 of the slide member 64 by means of screw 67. In addition to the slots 62c that surround the bosses 92a of the lower wiper blade assembly 62b, there is also formed in the lower surface of the floating wiper blade 62b a horizontally extending slot 69, whose rear-most vertically extending wall forms a shoulder 71. In the position shown in FIG. 11, the floating wiper blade member 62b overlies a sear bar 73. The sear bar 73 is urged upwardly against the underside of floating wiper blade member 62b by means of a plurality of small compression springs 75. The sear 73 is contained for vertical movement within a slot 77 formed within the enlarged shoulder portion 92 of the slide member 64. In addition, the sear 73 is urged upwardly by the springs 75, the underside of the sear 73 having small bores or sockets for receiving one end of the compression spring 75, and the other end of the compression spring, or lower end, is recessed in bores or pockets formed in the shoulder 92 of the slide member 64. This construction is clearly shown in FIG. 11.

The limit positions of the floating wiper blade can be varied by means of a set screw 62d, which has its inner terminal end abutting boss 92a, and upon adjustment, the position of the terminal toothed end of the blade can be set to ensure clearance therebetween and the DIP body.

In the condition illustrated in FIG. 11, the spring 75 is under compression. Sear 73 is biased upwardly against the underside of the floating wiper blade 62b.

Also, the wiper blade 62b is in its most extended position. This is the extended position of the floating wiper blade 62b, limited in this most forward position by means of the slot 62c abutting against the upstanding boss 92a. The sear 73 constitutes a bar-like structure that passes through the entire width of the shoulder 92, and with reference to FIG. 9 is shown extending beyond the left and right-hand terminal edges of the wiper blade assemblies and terminating in short trunnion-like members 79. Trunnions 79 engage in apertures formed in the upper terminal ends of links 81. The lower portion of the links 81 are held captive to the body of the wiper blade assembly by means of bolts 83 passing through elongated slots 85 in the link 81. As more clearly shown in FIGS. 9 and 10, side mounted guide blocks 61 are fixedly secured along the outer edges of upper fixed wiper blade 62a, providing against lateral displacement of the floating wiper blade 62b.

FIG. 12 illustrates a fully actuated position of the assembly head, that is, the slide 68 and the slide member 64 and the head 92 are drawn within the block 58 to the lowermost down position. This corresponds to the fully energized or extended position of the ram 74 or piston-cylinder actuator for cam 120. There exists a condition such that the teeth 93 of the upper wiper blade assembly 62a intermesh closely with the configuration of the separator blade 60. The floating wiper blade assembly 62b is illustrated in a withdrawn condition underlying the wiper blade 62a. In addition, as shown, not only is the blade withdrawn, it is also locked in this position. The teeth thereof have made contact with the upper surface of block 58 and further downward pulling of slide 68, 64 drives the floating wiper blade 62b rearwardly until sear 73 is allowed to move upwardly in front of the shoulder 71 and it locks the blade in that position. The upward motion of the sear 73 is terminated by engagement with the upper surface of slot 69, FIG. 12. Also as shown, the link 81 has moved angularly downwardly in an angular path. Anchor bolt 83 now engages the upper portion of the slot 85 within the link 81. FIG. 12, as stated, clearly illustrates the total downward position of the slide member 64, and the wiper blade assemblies. When the wiper blades are returned to a full retracted position as shown in FIG. 11, the slide members and the associated wiper blades now move upwardly away from the block member 58, and the wiper blade 62b is still maintained in a withdrawn and locked-up position through the greater portion of the return stroke. This is to insure that the toothed forward end of the floating wiper blade 62b does not come into engagement with the DIP sidewalls upon withdrawal of the wiper blade assembly to a starting position. Proximate termination of the stroke, the links 81 assume a nearly vertical position, and the lower portion of the slot 85 engages about the bolt 83 and restrains it from further sliding upward motion. The upper member of the link 81 is pivotally engaging the pin 79, tending to withdraw or downwardly direct this sear 73 and withdraws away from engagement with the shoulder 71 of the slot 69, thereby releasing the floating wiper blade 62b to the position shown in FIG. 11, but only at a time and in position when it is safely removed from the finished DIP. It should also be noted, and with particular reference to FIG. 12, that the left hand side of this slide member 64 has a series of cam surfaces 76. These surfaces are specifically designated as 76a, 76b, and 76c. The first of these cam surfaces 76a defines the rest or starting position of the wiper blades assemblies 62a, 62b, and rest position of the slide member 64, such that when all systems are at rest, the cam surface 76a lies adjacent the plate 90, as shown in FIG. 11.

Figure 21:
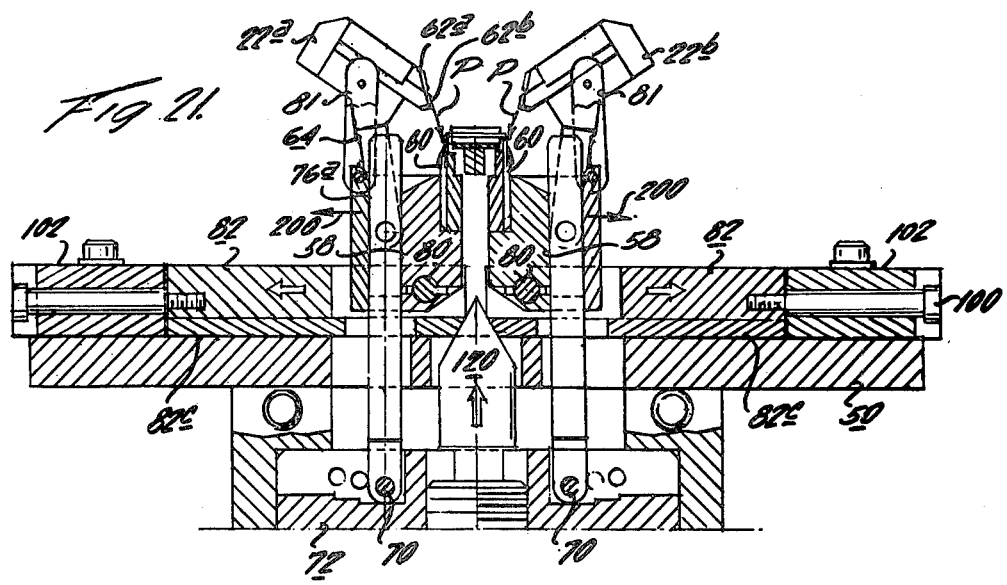

When the slide 68 and its associated slide 64 are drawn downwardly within the block 58, a shoulder 91 (FIG. 12) engages a transitional surface between cam face 76a and 76b and causes the clockwise rotation of the slide member 64, wiper blades 62a and 62b about the pivot point 66 and directing the wiper blade assemblies generally towards the center line of the trackway in a slightly arcuate path as indicated by arrow P in FIG. 21.

Not only are the wiper blades directed generally toward the center line of the trackway, but in addition the teeth 93 of the fixed wiper blade 62a align with the grooves 97a of the separator blade 60, while the floating wiper blade 62b toothed edge resiliently engages the apex of the teeth 97 of the separator blade 60, and this condition is maintained throughout the entire length of the cam portion 76b. During this cycle the teeth 93 of the fixed wiper blade 62a engage between the leads of a DIP starting above the shoulder to initiate straightening and general alignment of the shoulder and leg portions of bent leads with the grooves 97a of separator blade 60 for final straightening action by the teeth of floating wiper blade 62b as explained in more detail later. After further downward travel of the slide 68 and the slide 64, the shoulder 91 engages a second transitional portion of the slide 64 which imparts a very small additional clockwise movement to the wiper blade assembly 62a and 62b and it functions to place the fixed wiper blade 62a into working, straightening relationship with DIP leads during the travel over cam surface 76c.

Referring to FIG. 13, there is shown a fragmentary plan view illustrating definitive tooth construction of wiper blade 62a, floating wiper blade 62b and separator blade 60, and also illustrating the respective alignments of their teeth with respect to one another. Wiper blade 62a has a toothed edge comprising plural adjacent V-shaped teeth generally designated 93 having a root 93a, and a working generally flat rectilinear face 93b. Directly below, and in staggered relationship, there is shown the pattern of teeth on the leading edge of the floating wiper blade 62b. These teeth generally designated 95 are of a rectilinear pattern whose lower edges form a triangularly faced working surface 95a.

The separator blade 60 has a cooperating toothed configuration generally designated 97, similar to the pattern of teeth 93 on the fixed wiper blade 62a, and having a working root surface or groove 97a and an apex tooth portion 97b.

Functionally, the parts described perform in the following manner to provide the straightening of the leads of a DIP. With reference to FIG. 18, a DIP enters into the main forming station 20 wherein the separator blades 60 are adjacent the trackway, and the wiper blades are in an elevated position, and to the right and left of the trackway, providing a clear area for the DIP to enter. This condition is shown in the upper portion of FIG. 18. When the DIP is positioned as shown in FIGS. 18 and 7, it is brought to a stop by, means of a stopping means 144, FIG. 7, which consists of an air jet mechanism, schematically shown, which locates the DIP to be straightened so that the leads L are generally aligned with the grooves or recesses 97a of the separator blades. This air jet mechanism also initiates operation of the head assembly. DIPs are then located within the lengthwise confines of the separator blades which have the serrated outer faces as detailed in FIG. 13.

Figure 19:
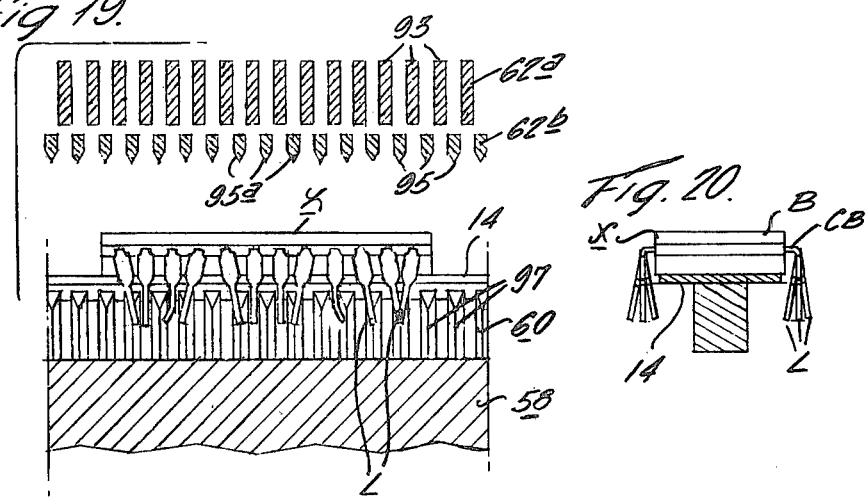
FIG. 19 is a greatly enlarged semi-schematic sectional view taken on line 19—19 of FIG. 18, showing in side elevation a banjo type lead DIP resting upon a trackway and the DIP having distorted and bent leads extending downwardly on either side of the trackway, and having spaced above the DIP a schematic representation of dual wiper blades, and below the DIP the associated separator blades.

Referring to FIG. 19 of the drawings, there is shown semi-schematically the positioning of the DIP and the relationship of the tooth configurations of the wiper blade 62a, and floating wiper blade 62b, and separator blade 60, all in relationship to one another in the condition shown in FIG. 19, wherein the damaged and twisted leads 52a are shown lying atop the plane of the separator blade 60.

Figure 20:
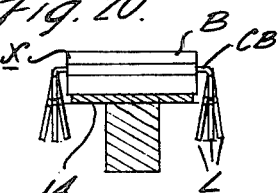
FIG. 20 is an end elevational view of the DIP shown in FIG. 19 resting upon the trackway, and illustrating the bent and distorted leads in a plane at right angles to that of FIG. 19.

FIG. 20 illustrates an end elevational view of the DIP shown in FIG. 19 resting upon the trackway 14 and illustrating the bent and distorted leads L in a plane at right angles to that of FIG. 19.

FIGS. 18, 19, and 20 show the positioning of a damaged DIP just prior to sequential operation of the machine to restore the damaged leads of the DIP to the desired aligned and straightened condition. In this regard and with respect to the following figures, the sequence of operation is now described. FIG. 17 shows a first step in the sequence in which the actuator cam acting member 120 of the ram 74 first moves in a forward direction. The cam faces of the member 120 engage the inner ends of the carrier slide plates 82c which are interconnected with the carrier guide plate 82, and tend to move these plates in a left and right-hand direction away from the center line of the trackway until their outermost edges abut stopblocks 102, whose positioning has been determined by the type of DIP to be restored. As the carrier block plates 82 and 82c move to the left and right of the center line of the trackway, they carry with them the pivotally mounted blocks 58, and slide members 68 and 64, whose lower terminal ends are pivotally secured to the slide member 72 by means of fast pins 70, all as previously described, so that in the showing of FIG. 17 the blocks 58 have been pivoted outwardly about the pivot 80. This causes the separator blades 60, which are attached to the blocks 58, to move outwardly to the left and to the right from under the trackway to a predetermined position, depending on the type of DIP to be worked on. This motion of the separator blades 60 forces the crossed and overlapped leads 52a to be bent outwardly, establishing a minimum spread distance for the finished and straightened leads. The separator blades move outwardly from under the trackway, and their teeth 97, as shown in FIG. 19, interengage some of the less damaged leads, generally aligning them into pockets or grooves 97a, while the more damaged leads are carried over and about the crowns 97b of the tooth configuration of the separator blades 60. The top edges of the crowns 97b of the separator blades are bevelled at 60c at an angle of approximately 30° to permit easier alignment of the leads during the initial combing action.

Since the actuator head member 120 of the ram 74 can no longer move in a forward or outwardly direction, as shown by the arrow in FIG. 21, since the carrier slide plates 82 and 82c have now abutted the stopblocks 102, a reactive condition takes place wherein the ram itself and its attached carrier plate and attached slide member 72 begin to move rearwardly. As this continues, the slide 68 and associated slide 64 begin to move in a rearward direction or downward direction as shown by the arrows in FIG. 22. It should be noted that in FIG. 21 the cam face of the arm of the slide 64 is in a rest or home position, such that the cam face 76a lies adjacent the face of the backup plate 90, and described with reference to FIGS. 11 and 12. Also, it is shown that the wiper assemblies 22a and 22b have been rotated in a direction toward the center line of the trackway or DIP. The amount of rotation in this direction is due to the interaction of the cam face 76b cooperating with the shoulder 91, as detailed in FIGS. 11 and 12 of the drawings. As the slide moves rearwardly and draws the slides 68 and 64 downwardly within the blocks 58, there arises a condition such that the tooth edges of the wiper blades 62a and 62b approach the DIP body at predetermined desired angles of attack. As the wiper blades assume a desired zero degree angle of attack with respect to the sidewalls of the DIP and descend upon the DIP from above, the floating wiper blade 62b travels closely adjacent the sidewalls of the DIP body, and intermediate leads L on the DIP body. The fixed wiper blade 62a, as shown in FIG. 22 have not been brought into operational contact with the DIP at this point.

Figure 22:
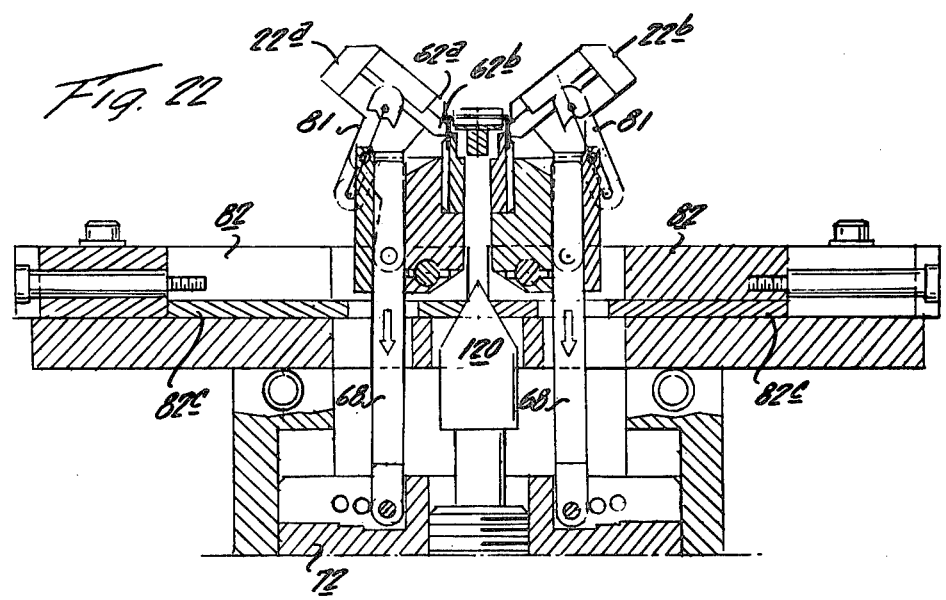
Figure 23:
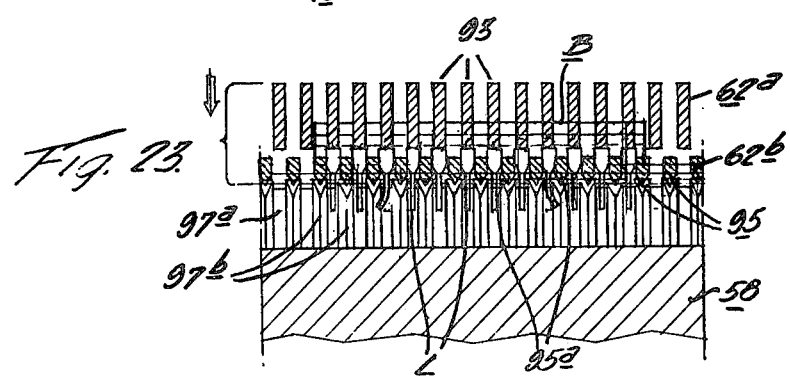

FIG. 23 is a view similar to FIG. 19, the condition existing in the step illustrated in FIG. 22. This shows teeth 95 of the lower floating wiper blade 62b, now lying closely adjacent the body of the DIP, and also that the teeth 95 fall intermediate the leads L of the DIP. It also shows that, descending at the same rate and space above the wiper blade teeth 95, is the wiper blade 62a and its associated teeth 93. Also it is noted, with reference to FIG. 23 that nothing at this point has been done to restore the leads to their proper alignment, or that restoration has as yet taken place. The distorted and overlapped leads L remain in the same condition and overlying the plane of the spreader blade 60 as shown in FIG. 19, with the exception that since the separator blades 60 have been actuated as shown in FIG. 21, the more undamaged leads fall within the pockets 95a of the separator blade teeth 60. The more damaged and distorted, or possibly overlapping leads such as at of DIP are carried or pushed outwardly upon the crowns 97b of separator blade teeth 60.

Figure 24:
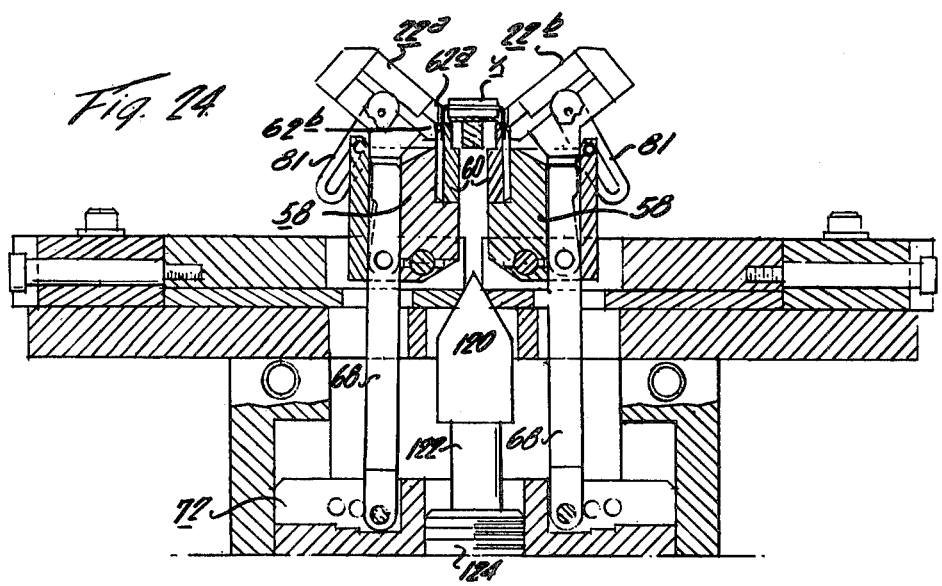
Figure 25:
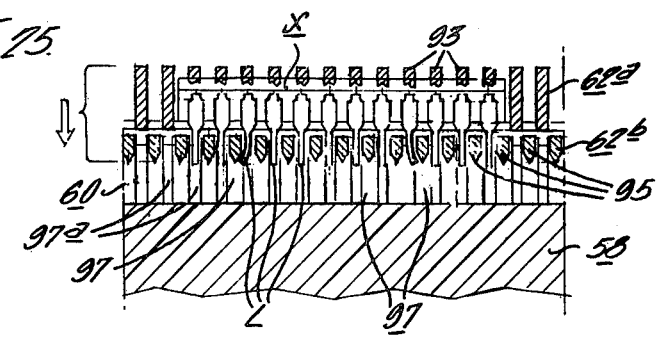

FIG. 24 illustrates a further development in the sequencing in that as the slide 68, and associated slides 64, continue their downward travel within block 58, the wiper blades 62a and 62b are now brought into working relationship with the overlapping and bent leads. From FIGS. 24 and 25, it is seen that the floating wiper blade 62b now touches or physically has made contact with the beginning of the crown of the separator blade 60. At this time, its function to spread or straighten the leads L is initiated, as shown in FIG. 25. As described before, the lower faces of the floating wiper blade teeth 95 have triangularly shaped working faces 95a. Also, the teeth 95 of the lower wiper blade 62b are positioned intermediate the leads 52a and while performing their lead separating function, the teeth 95 engage the separator plate 60, contacting crowns 97b of separator plate 60 and maintain this contact as they move downwardly across the crown. As the working face of the teeth 95, that is the triangular portion 95a, comes into contact with overlapping or more seriously angularly displaced leads 52a, the teeth 95 tend to separate these leads, and wipe them into a more generally aligned condition such that the bent tips of the leads now more closely lie over the grooves 97a of the separator blade teeth 60. This condition is clearly illustrated by comparison of FIG. 23 and 25.

Figure 26:
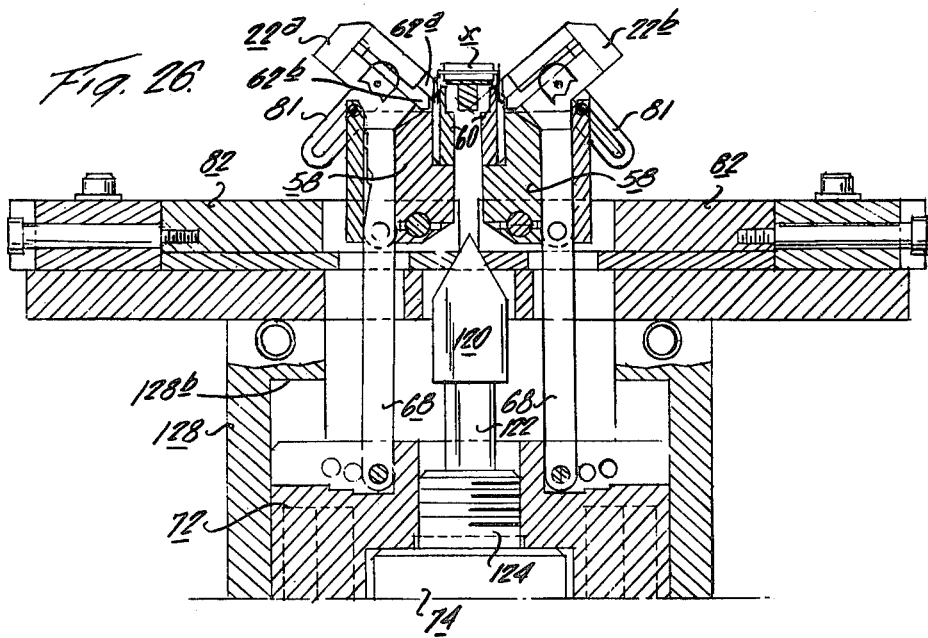

FIG. 26 illustrates the final positioning in the sequence, wherein the wiper blades 62a and 62b have finished straightening and aligning the leads of the DIP. In this position the ram 74, and associated slide member 72, have reached their full limit of stroke. The slide members 68 and 64 and associated wiper blades 62a and 62b have reached their lowermost position with regard to the block 58. In moving from the position shown in FIG. 24 to that shown in FIG. 26, the teeth 95 of wiper blade 62b have fully combed through the leads L, and the more angularly displaced leads L, positioning them for final straightening and alignment within the pockets 97a of the separator plate 60 by means of the fixed wiper blade teeth 93 coacting with the separator blade. Having performed this function, they continue in their downward travel a very small distance farther until the teeth of wiper blade 62b engage the top face of block 58 and wiper blade 62b is snapped back into a retracted position as shown in FIG. 12 and as hereinbefore described. In this condition the teeth 95 of the wiper blade assembly 62b no longer make physical contact with the crowns of the separator blade teeth 97, but the teeth 93b of the upper fixed wiper blade 62a have now performed their function of completing straightening and aligning the leads 52a, such that the working face of the teeth 93b coact with the separator blade 60, confining the leads L between the working surface 93b of the teeth 93, and the root 97a of the separator blade teeth 97.

With regard to FIG. 27, it is seen that when the wiper blades 62a and 62b are in their lowermost position shown as in FIG. 26, and the damaged leads 52a have been straightened and aligned, by means of the foregoing interaction of the teeth and the separator blade, the DIP 52 and its respective leads are held interlocked in this condition. Now as found necessary for the further perfection of the straightening process, an oscillation can be performed at this point. This is initiated by means of switch 42, with reference to FIG. 1. The mechanics and mechanism of this oscillation are described with reference to FIGS. 4, 5, 5a and 5b, 6 and 7 of the drawing. This oscillation function serves, as brought out, to eliminate elastic memory in the leads following the straightening steps as above set forth. Also, as hereinbefore set forth, for some DIPs, but rarely, the oscillating step can be selectively omitted.

It is also to be noted that when the slide mechanism 72 reaches the position shown in FIG. 26, its lowermost edge will engage a limit switch 131, carried in one of the end spring-retaining blocks 130, as shown in FIG. 18. Upon actuation of this switch, a signal is sent through a selector switch in the logic control, reversing the flow in the piston cylinder actuator 74 which in turn retracts permitting upward movement of slide member 72 under the action of springs 142 and in turn initiating return of the head assembly to the upper open position illustrated in FIG. 18. When slide member 72 engages surface shoulder 128b, the action of piston cylinder 74 retracts actuator 120 downwardly permitting inward movement of separator blades which are spring biased to their inner retracted position shown in FIG. 18 and now the head assembly is conditioned to permit discharge of the conditioned DIP device. A sensor SE shown schematically in FIG. 2 is located on the discharge section of the trackway below the straightening station 20 which is activated when a conditioned DIP is discharged. This activates a singulating system in the logic circuitry to permit the next DIP device to be singulated, opening a DIP stop, not shown, positioned in the entrance of the trackway above the straightening station 20 to release a succeeding DIP which will in turn slide into the straightening station. As noted previously, the new DIP entering the straightening station 20 is positioned so that its leads L are generally aligned with the grooves or recesses 97a of the separator blades by the air jet mechanism 144 which also through the logic circuit initiates the next cycle of operation of the head assembly. It is noted that the circuitry for singulating the DIP devices through the machine in a continuous automatic operation as described above is generally similar to the logic or control circuit set forth in the present inventor's prior U.S. Pat. No. 3,880,205, which patent is incorporated by reference herein.

As the slides are raised upwardly through the blocks 58, the wiper blades 62a and 62b are locked into a condition shown in FIG. 12, with the lower floating wiper blade 62b and its associated teeth 95 in a retracted condition. The teeth remain inoperative and substantially removed from either the separator plate teeth or the DIP leads, or body of the DIP. It is desirable to safely bypass the DIP body when withdrawing or returning to the position shown in FIG. 14, so as not to damage the restored DIP or to raise the DIP off the track. As the slides 68 and 64, and associated wiper blades 62a and 62b approach the limit of return travel, links 81 are moved from a more or less angular positioning as shown in FIG. 12 to a nearby vertical position wherein the anchor bolt 83 causes link connections, through trunnions 79, to draw down upon sear bar 73, releasing the cocked slide 62b, and returning it to an extended condition shown in FIG. 11. FIG. 28 is a view similar to FIG. 19, but showing a condition such that the wiper blade 62a and wiper blade 62b have been returned to a condition shown in FIG. 14, and the finished or final straightening process of the leads 52a has been performed. The finished and straightened DIP is now allowed to proceed down the track to discharge at station 26.

FIG. 29 of the drawings is a view similar to FIG. 20, showing in full lines a DIP, but showing the leads 52a restored to their desired condition.

The foregoing function and operation of the apparatus is controlled, and functionally driven by appropriate pneumatic and electrical circuitry, as will be well known to those skilled in the art, and can be controlled by pre-determined and pre-set logic, as set in a logic circuit of an appropriate type.

The foregoing description has been concerned with the banjo type DIP of FIG. 3C, 3D, 3E and 3F. As previously mentioned, the apparatus is usuable with other types of DIPs and other lead configurations. In this connection, reference is made to FIG. 3A, showing a side brazed type DIP 52 having leads 52A. In this DIP type the leads are disposed flush against the opposing side edges of the body and there is, therefore, no connecting bridge or outward extension of the leads.

In order to straighten leads in a side-brazed type DIP, the machine is modified as shown in FIG. 14. The links 81 are provided with an additional hole 81a for positioning of trunnions 79 therein. To use this modification for side-brazed lead straightening, the links 81 are removed from their attachment with the machine, and the trunnions numeral 179 are placed in the additional openings 81a as in FIG. 14. This in effect lengthens link 81. In this arrangement, see FIGS. 16 and 17 the links will not draw down on the sear; i.e., the sear is inoperative since the vertical distance between the bottom of the slot and the pin operatively confined therein is too great to act on the sear 73, and the floating wiper blade is inactive. The normal action of the floating wiper blade as hereinabove described for straightening of banjo-type leads; i.e., penetratively extending between the teeth proximate the uppermost portions of the downwardly directed leg portions is eliminated. The engagement of the leads is removed from the portion abutting the sides of the body, and the straightening occurs below the DIP body by action of the fixed wiper blade 62 and separator blade 60.

Recapping briefly the operation of the straightening mechanism of the present invention and focusing primarily on the interaction of the floating and fixed blade of the head assembly and the separator blades in the operation of aligning and straightening the leads of a DIP device, as described previously and as clearly shown in the drawings, and assuming a DIP to be reconditioned at the straightening station and the parts are in the position shown in FIG. 21, as the head assembly is moved initially downwardly toward the DIP device, the teeth move in a slightly arcuate path P under the control and influence of the cam sections 76a, 76b, 76c. The teeth of the floating blade 95a which confront with the teeth 97b of the separator blades initially contact or engage the bevelled face 60c thereof and during the downward stroke ride on the face of the teeth 97b against the bias of the floating blade springs. During this action, the teeth 95a of the floating wiper blade enter the spaces between the leads L above the shoulders to effect the initial straightening action. The bevel 60c also allows clearance for the initial movement of bent leads at the shoulder portion so that they generally align with the grooves 97a in the separator blade and facilitate the initial orientation process effected by the teeth 95a of the floating blade. (This relative position of the parts is illustrated in FIG. 16.) Now as the head assembly is actuated further downwardly to the point where the head assembly is riding on the cam portion 76c, the teeth 93b of the fixed wiper blades 62a are moved to a position which are staggered or offset linearly relative to the teeth 95a of the floating wiper blade and are aligned as illustrated in FIG. 13 with the alternating grooves 95d between each of the adjacent teeth of the floating wiper blade mesh and engage in the grooves 97a of the separator blade to perform the final straightening action on the leads L of the DIP devices as clearly shown in FIG. 17. During this phase of the straightening cycle, the downward movement of the teeth of the fixed wiper blade move in a plane generally parallel to the grooves in the separator plate. Also note that during this latter phase, the teeth of the floating wiper blade ride from the bevelled face 60c along the crown of the separator blade teeth as clearly shown in the drawings, the teeth and groove pattern of the fixed and floating wiper blades and separator blades are spaced uniformly and in a predetermined pattern or relation for a given DIP device to effect the separation and straightening action described. It is noted that the head and separator blades are easily interchangeable if need be to accommodate the apparatus for DIP devices having different lead configurations or spacing.

Further and additional differences and advantages will appear from the detailed description of a preferred single embodiment of the invention shown and described herein.

What is claimed is:

1. Mechanism for aligning leads of electronic devices having a body portion and a plurality of leads extending from the body portion comprising at least one separator blade having a series of spaced alternating lands and grooves oriented to receive the leads of the device arranged and oriented in a pattern corresponding generally to the desired pattern and orientation of the leads in a conditioned device, a head assembly cooperatively associated with said separator blade comprising a floating blade having a series of teeth adapted to initially engage between adjacent leads of the device to orient the same in general relation to the grooves in the separator blade upon relative movement of said separator blade and head assembly, and a wiper blade having means operable for engaging the leads in the grooves of the separator plate upon said relative movement.

2. Mechanism for aligning leads as claimed in claim 1, and means for oscillating said leads subsequent to final orientation in the grooves of said separator plate to reduce elastic memory in the lead material to increase retention of the appropriate finalized position of the oriented leads.

3. An electronic component lead straightening device for conditioning electronic devices having an elongated body portion and a plurality of leads extending from opposite edges of the body portion, said leads including a relatively thin connecting bridge extending in the plane of the body and outwardly therefrom, a depending lead leg attached to the outer end of said connecting bridge and depending downwardly therefrom, said leg having a flat shoulder adjacent said connecting bridge and wider than said connecting bridge and a terminal end portion thinner than said flat shoulder, said leads being subject to bending primarily in the length of said connecting bridge, wherein the leads are to be disposed at a predetermined angle outwardly from the longitudinal center line of the body, and substantially parallel to one another, comprising lead component support means to support an electronic device in a work station, work means in said work station, said work means including a compound head assembly, said head assembly including means operable to sequentially initially spread said leads outwardly from said body to a predetermined angle to said body, secondly to untangle overlapped and tangled ones of said leads if necessary and generally align said leads into parallel relationship with one another by engagement of movable toothed lead orienting means between adjacent ones of said leads in proximity to the upper edges of the said flat shoulder portions and below said connecting bridge, subsequently orient said leads in respective common planes on opposite sides of said body and in substantial parallel relation to one another, said lead spreading means comprising a set of opposed separator blades having grooves in the active faces thereof adapted for engaging said leads, said separator blades being respectively simultaneously movable outward to angularly spread said leads to said predetermined angle, said general lead aligning means comprising a floating toothed wiper blade extending initially out from said head and the teeth being engageable between adjacent said leads, and subsequently being retractable within said head, and further including a fixed toothed wiper blade extendable into engaging position with said generally aligned leads and operable to force said leads into appropriate corresponding grooves in said separator blades for final orientation of said leads.

4. An electronic component lead straightening device as claimed in claim 3, said floating toothed wiper blade and said fixed toothed wiper blade being operatively mounted to said head assembly, said head assemblies being respectively mounted to a first movable slide and said first slide being pivotally mounted to a second slide, said slides being movable conjointly to initially move said head assembly in an arcuate path to engage the teeth of said floating toothed wiper blade between upper portions of said leads, then draw the teeth downwardly parallel to and between the leads for an initial orientation thereof, withdraw said floating wiper from operative engagement with the leads, engage the teeth of said fixed wiper blade with and intermediate the initially oriented leads and wipe said leads into the grooves of said separator blades.

5. An electronic component lead straightening device as claimed in claim 4, a plural stepped face cam surface on said first slide, a grooved block mounting said slides for movement therein, a cover plate over said groove in said block, coacting with said respective cam surfaces to operatively functionally move slides and wiper blades mounted thereto.

6. A method of aligning leads of electronic devices having a body portion and a plurality of leads extending from the body portion, and consisting of the steps of: first engaging a toothed separator means against the inner surfaces of the leads and spreading the leads to a generally predetermined outward angle from the vertical plane passing through the body; engaging first toothed lead straightening and general orienting means between the leads and move the teeth along at least part of their length to initially untangle, bend and generally orient the leads into general parallel relation to one another, and engaging second toothed lead straightening means to the generally oriented leads to wipe the generally initially oriented leads into a final substantial parallel relationship with one another.

7. A method as claimed in claim 6, including the further step of oscillating the finally parallel leads to reduce elastic memory of the material of the leads, to increase retention of the appropriate finalized position thereof.

8. A method as claimed in claim 6, including engaging the first toothed lead straightening and general orienting means between the leads proximate the upper ends thereof adjacent the point of connection of said leads with said body.

9. A method as claimed in claim 8, wherein the final lead orientation comprises the steps of wiping the leads into grooves of the toothed separator means for final lead orientation.

* * * * *